United States Patent
Perrin et al.

(10) Patent No.: US 6,765,729 B2
(45) Date of Patent: Jul. 20, 2004

(54) CATADIOPTRIC REDUCTION LENS

(75) Inventors: Jean Claude Perrin, Givry (FR); Alexander Epple, Aalen (DE); Wilhelm Ulrich, Aalen (DE)

(73) Assignee: Carl Zeiss SMT AG, Oberkochen (DE)

(*) Notice: Subject to any disclaimer, the term of this patent is extended or adjusted under 35 U.S.C. 154(b) by 0 days.

(21) Appl. No.: 10/052,396

(22) Filed: Jan. 23, 2002

(65) Prior Publication Data

US 2002/0167737 A1 Nov. 14, 2002

(30) Foreign Application Priority Data

Jan. 24, 2001 (DE) .......................................... 101 04 177

(51) Int. Cl.[7] .......................... G02B 17/00; G02B 27/14
(52) U.S. Cl. ...................................... 359/727; 359/633
(58) Field of Search ................................ 359/726, 727, 359/733, 629, 633

(56) References Cited

U.S. PATENT DOCUMENTS

| | | | |
|---|---|---|---|
| 4,953,960 A | 9/1990 | Williamson | 359/663 |
| 5,052,763 A | 10/1991 | Singh et al. | 359/355 |
| 5,289,312 A * | 2/1994 | Hashimoto et al. | 359/487 |
| 5,402,267 A | 3/1995 | Fuerter et al. | 359/727 |
| 5,668,672 A * | 9/1997 | Oomura | 359/727 |
| 5,694,241 A * | 12/1997 | Ishiyama et al. | 359/364 |
| 5,715,084 A | 2/1998 | Takahashi et al. | 359/467 |
| 5,742,436 A | 4/1998 | Fuerter | 359/727 |
| 5,771,125 A | 6/1998 | Ishiyama | 359/727 |
| 5,808,805 A | 9/1998 | Takahashi | 359/651 |
| 5,880,891 A | 3/1999 | Fuerter | 359/651 |
| 5,999,333 A | 12/1999 | Takahashi | 359/726 |
| 6,081,382 A * | 6/2000 | Omura | 359/629 |
| 6,101,047 A | 8/2000 | Chung et al. | 359/726 |
| 6,108,140 A | 8/2000 | Hashimoto et al. | 359/727 |
| 6,118,596 A | 9/2000 | Hashimoto et al. | 359/727 |
| 6,208,473 B1 * | 3/2001 | Omura | 359/727 |
| 6,512,641 B2 * | 1/2003 | Omura | 359/727 |

FOREIGN PATENT DOCUMENTS

| | | |
|---|---|---|
| DE | 42 03 464 A1 | 8/1992 |
| DE | 44 17 489 A1 | 11/1995 |
| DE | 196 16 922 | 10/1997 |
| DE | 198 22 510 A1 | 11/1999 |

OTHER PUBLICATIONS

Willi Ulrich et al., "Trends in Optical Design of Projection Lenses for UV—and EUV—Lithography", Proceedings of SPIE, vol. 4146 (Aug. 2000), pp. 13–24.

* cited by examiner

Primary Examiner—Georgia Epps
Assistant Examiner—William Choi
(74) Attorney, Agent, or Firm—Sughrue Mion, PLLC (57) ABSTRACT

A catadioptric projection lens for projecting a pattern located in an object plane onto an image plane without an intermediate image includes the following components between the object plane and the image plane in the given order: a first lens part for creating a beam that is directed at a physical beam splitter, a physical beam splitter with a beam splitter surface, a mirror group with a concave mirror, and a second lens part with positive focal power to create an image of the pattern on the image plane. The mirror group preferably has no free-standing lens, and the focal power of the mirror group is largely determined by the magnification of the concave mirror. The focal power of the mirror group is large enough to convert the incident divergent beam into a convergent beam. The system aperture is located on the image side behind of the concave mirror, preferably at the exit of the beam splitter.

28 Claims, 4 Drawing Sheets

CATADIOPTRIC REDUCTION LENS

The following disclosure is based on German Patent Application No. 101 04 177.2 filed on Jan. 24, 2001, which is incorporated into this application by reference.

BACKGROUND OF THE INVENTION

1. Field of the Invention

This invention relates to a catadioptric projection lens for projecting a pattern from an object plane onto an image plane.

2. Description of the Related Art

Such projection lenses are used in projection exposure systems for producing semiconductor devices and other microdevices, in particular in wafer scanners and wafer steppers. They are used to project patterns of photo masks or reticle plates (in the following simply called masks or reticles) onto an object coated with a photosensitive layer. The projection is performed with highest resolution and in reduced scale.

In order to create increasingly fine structures, it is necessary to increase the numerical aperture (NA) of the projection lens on one hand and to use increasingly shorter wavelengths on the other hand, preferably ultraviolet light with wavelengths of less than approx. 260 nm.

In this wavelength range there are only few sufficiently transparent materials for producing the optical components, in particular synthetic quartz glass and fluoride crystals, such as calcium fluoride, magnesium fluoride, lithium calcium aluminum fluoride, lithium strontium aluminum fluoride, barium fluoride, lithium fluoride, or the like. Since the Abbé constants of the available materials are relatively close together, it is difficult to provide pure refractive systems with sufficient correction of color aberrations (chromatic aberrations). In principle, this problem could be solved by using pure reflective systems. However, the fabrication of such mirror systems is costly.

Considering the problems mentioned above, catadioptric systems are preferable for projection lenses of very high resolution. In catadioptric systems refracting and reflecting components, therefore in particular lenses and mirrors, are combined.

When using mirror surfaces for projection, it is advantageous to use beam splitters to achieve obscuration-free and vignette-free images. There exist systems with geometrical beam splitters as well with physical beam splitters. A system with a geometrical beam splitter that uses two deviating mirrors is shown in EP 0 989 434 (corresponding to the U.S. Ser. No. 09/364382). Systems with a geometrical beam splitter have the disadvantage that they must necessarily be off-axis systems. By using a physical beam splitter, however, on-axis systems can be realized.

A system with a physical beam splitter and an intermediate image is known from EP-A-0 475 020 (corresponding to U.S. Pat. No. 5,052,763). This system has at least one catadioptric entry system and one dioptric exit system. The mask to be projected rests directly on a beam splitter, designed as a beam splitter cube (BSC). With the help of the beam splitter, part of the light reflected by the catadioptric system is diverted to the dioptric system. With the object to be projected resting directly on the beam splitter, the correction possibilities of the total system are restricted. Furthermore, this contact procedure has extremely high demands with respect to material quality and can cause mechanical problems due to the lack of working distance.

From EP-A-0 350 955 (corresponding to U.S. Pat. No. 4,953,960), a catadioptric projection lens without intermediate image is known. This projection lens system consists of a first lens group between the object plane and a physical beam splitter, a second lens group between the physical beam splitter and a concave mirror, and a third lens group between the physical beam splitter and the image plane. The lens group between the beam splitter and the concave mirror is supposed to correct comas of low degrees, spherical aberrations of the mirror, and the Gauss' error.

From DE-A-42 03 464 (corresponding to U.S. Pat. No. 5,402,267), a catadioptric projection lens with physical beam splitter and without intermediate image is known that permits high rear numerical aperture of at least 0.5 with a favorable construction and low adjustment sensitivity. The system distinguishes itself mainly by the fact that there is no lens group between the concave mirror and the beam splitter and that the concave mirror has a considerable reduction effect, i.e. a strongly reducing magnification. The correction of the chromatic longitudinal ray aberration (CHL) is mainly achieved with a strongly convergent ray trajectory in the beam splitter cube and may cause total achromatization of the chromatic longitudinal ray aberration. Typically the ray trajectory in front of the mirror, i.e. in the first passage through the beam splitter, is nearly collimated, while the ray trajectory behind the mirror, i.e. in the second passage through the beam splitter is normally strongly convergent. The system aperture is preferably located where the concave mirror is and is defined by the mirror rim. The aperture may also be defined on the mirror-side bounding surface of the beam splitter or between mirror and beam splitter. The strongly convergent ray trajectory after the concave mirror has the further advantage that only little positive focal power is needed after the beam splitter and that the beam heights are relatively small in this area so that negative effects on the chromatic aberration due to large beam heights in this area can be avoided. Projection lenses with these or comparable constructional and functional characteristics are called type I for the purpose of this application.

With these advantages, type I lenses have the disadvantage that the radiation reaches the beam splitter surface convergent, in particular in the second passage after being reflected by the concave mirror, causing a very large angle of incidence range. This has higher demands with respect to the quality of the beam splitter layer. In addition, the strong convergence of the ray trajectory after the concave mirror leaves very little room for lenses behind the beam splitter and thus little room for correctional measures. A further increase of the rear numerical aperture would require enlarging the beam splitter cube so that the image plane would have to be even closer to the beam splitter. For this reason, projection lenses of type I are also known as aperture limited.

Essentially similar problems also occur for other projection lenses that are constructed according to type I as far as the build-up and the ray trajectory is concerned. Among these are the projection lenses shown in the US patents U.S. Pat. Nos. 6,118,596, 6,108,140, 6,101,047. Large angles of incidences on the beam splitter surfaces may also occur in systems that create an intermediate image, shown for example in U.S. Pat. No. 5,808,805 or U.S. Pat. No. 5,999,333.

From U.S. Pat. No. 5,771,125, a catadioptric projection system with physical beam splitter and without an intermediate image is known where the rays are slightly divergent during their first passage through the beam splitter layer and are collimated during the second passage after being reflected by the concave mirror. This is to avoid deterioration of the image quality due to the dependence of the beam splitter layer's reflectivity on the angle of incidence. The collimation of the reflected light is achieved by keeping the focal power of the mirror group containing the concave mirror relatively low. In the system of EP-A-0 602 923 (corresponding to U.S. Pat. No. 5,715,084), however, a positive lens is provided in front of the physical beam splitter in order to collimate the rays that reach the beam splitter layer during the first passage. After being reflected by the concave mirror, it is convergent.

In order to minimize the angle of incidence on the beam splitter layer, DE-A-44 17 489 (corresponding to U.S. Pat. No. 5,742,436) suggests positioning at least one convergent lens on the object-side in front of the physical beam splitter in a catadioptric projection system without intermediate image in order to make the ray arriving at the beam splitter layer parallel. Behind the physical beam splitter in the catadioptric lens part, i.e., between the beam splitter and the concave mirror, a dispersing lens group with a negative lens is provided, compensating for the effect of the convergent lens in front of the beam splitter and correcting the chromatic longitudinal ray aberration. In this design, called type II for the purpose of this application, the system aperture is behind the beam splitter cube and the ray trajectory in the beam splitter cube is largely collimated in both passage directions.

As the ray trajectory in the beam splitter cube is largely collimated in both passage directions, problems occurring with large ranges of angles of incidence are avoided. Another advantage of the collimated ray trajectory in the second passage after the reflection at the concave mirror is that on the rear of the beam splitter in the aperture space, there is enough room for building corrective measures. A disadvantage of the arrangement according to DE-A-44 17 489 is that the correction of the longitudinal chromatic aberration (CHL) is incomplete.

SUMMARY OF THE INVENTION

One object of the invention is to provide a projection lens with a physical beam splitter that avoids the disadvantages of the prior art. It is another object to allow for a nearly complete chromatic correction for very large image side numerical aperture and favorable construction. This shall be achieved through low material use with respect to mass and/or number of optical components.

As a solution to this and other objects, this invention, according to one formulation, provides a catadioptric projection lens that projects a pattern from the object plane onto an image plane which includes the following components between object plane and image plane in the given order: a first lens part for creating a ray directed at a physical beam splitter, a physical beam splitter with a beam splitter surface, a mirror group with a concave mirror and a mirror focal power of the mirror group, and a second lens part with positive focal power for creating an image of the pattern on the image plane, wherein the focal power of the mirror group is large and the system aperture is located imagewise behind the concave mirror.

The large focal power of the mirror group permits a ray trajectory in which the light arrives at the mirror group divergent and exits convergent in direction of the beam splitter surface. It is thus possible for the beam splitter to be radiated with non-collimated light in the first as well as in the second passage. Due to the angled light passage, the beam splitter can thus contribute to the chromatic correction.

It is advantageous if the sum of the absolute values of the paraxial peripheral ray angles is much larger than zero during the first and the second passage. The sum of the absolute values of the paraxial peripheral ray angles is preferably more than 30% or 40% of the numerical aperture, in particular, it may be in the range around 60% of the numerical aperture. At the same time, the positioning of the system aperture imagewise behind the concave mirror ensures that, even for high image side numerical aperture, the maximum beam heights on the rear of the beam splitter are limited to acceptable values. This avoids problems due to large lens diameters in the construction of the second lens part. The system aperture here is the axial position where the principal ray intersects with the optical axis. A position of the system aperture between the beam splitter surface and the image plane, in particular a position near or at the rear exit surface of the beam splitter, is preferable.

The projection preferably takes place without an intermediate image.

The first lens part is preferably designed so that a divergent ray is created that is directed at the beam splitter. Strongly diverging rays are preferable where peripheral ray angles may occur that are larger than 20% of the rear numerical aperture and may be between 30% and 40% of the rear numerical aperture for example. The peripheral ray angle u in this case is the product of the refraction coefficient n of the medium that is passed and the sine of the angle between peripheral ray and optical axis.

In preferred embodiments, a strong beam divergence with favorable lens part diameter is achieved by having a first lens part in front of the beam splitter that has a negative focal power, preferably at least two negative lenses, to create a narrow section in the ray trajectory.

It is also favorable to have a focal power of the mirror group that is so large that the ray on the rear of the mirror group is convergent. To achieve a considerable contribution to the chromatic correction, is has been shown to be effective to have a peripheral ray angle of the exiting convergent ray that is larger than approx. 10% of the rear numerical aperture of the projection lens. On the other hand, strongly convergent rays should be avoided so that there is enough space behind the beam splitter to set up lenses and other optical components affecting the rays. For this reason, the peripheral ray angles should not exceed or not considerably exceed approx. 30% of the rear numerical aperture.

It is effective to have an absolute value of the peripheral ray angle during the first passage before passing through the mirror group that is larger than the angle after the mirror reflection. Preferably, a strong divergence before passing through the mirror group is turned into a convergence with a lower absolute value so that the main contribution to the chromatic correction already takes place during the first passage through the beam splitter.

Particularly preferable are embodiments where there is no free-standing lens between the beam splitter surface and the concave mirror. The concave mirror is preferred to have positive magnification. With its large focal power it contributes to the total focal power without causing chromatic aberrations. It also corrects the Petzval sum of the projection lens.

With the invention, it is possible to perform the chromatic correction mainly before the ray enters the second lens part, i.e., mainly in the area of beam splitter and mirror group. This makes it possible to have an especially favorable design of the second lens part with respect to dimensioning and material requirements. In particular, it is unnecessary to provide highly effective chromatic corrective means so that the second lens part may be made of lenses made of a single material, at least in the area of large beam heights, i.e., at a certain distance from the image plane. Embodiments of the invention distinguish themselves in that essentially all transparent optical components are made of one material, for example calcium fluoride, also known as fluorspar ($CaF_2$), or synthetic quartz glass ($SiO_2$). When using $SiO_2$, a second radiation resistant material, such as $CaF_2$, may be used close to the image plane where high power-densities of the rays occur in order to avoid compaction problems for example. The lens material used mainly or exclusively can thus be calcium fluoride or another fluoride crystal material, in particular if the system is designed for wavelengths of less than approx. 160 nm. For larger wavelengths, such as wavelengths around 193 nm, it is also possible to use synthetic quartz glass mainly or exclusively.

In order to achieve good monochromatic correction or a high imaging power and low aberration with very high numerical aperture while reducing material expenditure, one or more aspherical surfaces may be used in an embodiment. In this case, a larger number of aspherical surfaces is normally used but preferably not more than eight. In particular regarding the correction of the spherical aberration and of comas, it is effective to position at least one aspherical surface in the area of the system aperture. A particularly effective correction is achieved if the ratio $h/\phi$ between the peripheral ray height h on the surface and the radius $\phi$ of the opening of the system aperture is between approx. 0.8 and approx. 1.2. The peripheral ray height close to the aspherical surface should thus be close to the maximum peripheral ray height.

In order to enable an effective correction of the distortion and other field aberrations, it is effective to also provide at least one aspherical surface close to the field, i.e., close to the reticle, or on the object plane and/or close to the wafer or the image plane. These areas in proximity to the field distinguish themselves by the fact that the ratio $h/\phi$ is smaller than approx. 0.8. It is favorable to have at least one aspherical surface in proximity to the field and at least one aspherical surface close to the system aperture. It is thus possible to provide sufficient correction for all optical aberrations discussed.

The previous and other properties can be seen not only in the claims but also in the description and the drawings, wherein individual characteristics may be used either alone or in sub-combinations as an embodiment of the invention and in other areas and may individually represent advantageous and patentable embodiments.

DETAILED DESCRIPTION OF THE PREFERRED EMBODIMENTS

In the following description of preferred embodiments, the term "optical axis" stands for a straight line or a succession of straight line sections through the centers of curvature of the optical components. The optical axis is bent at deviating mirrors or reflecting surfaces. Directions and distances are called "rear" or "image side" if they are oriented in the direction of the image plane or the substrate to be exposed there. They are called "object-side" if they are oriented in the direction of the object with respect to the optical axis. The object in the examples is a mask (reticle) with the pattern of an integrated circuit. However, it may also be a different pattern, e.g., a lattice. In the examples, the image is created on a wafer equipped with a photosensitive layer that serves as the substrate. However, other substrates, such as elements for liquid crystal displays or substrates for optical lattices are also possible. For clarity purposes, identical or corresponding characteristics of the different embodiments are labeled with the same reference marks in the following.

Figure 1:
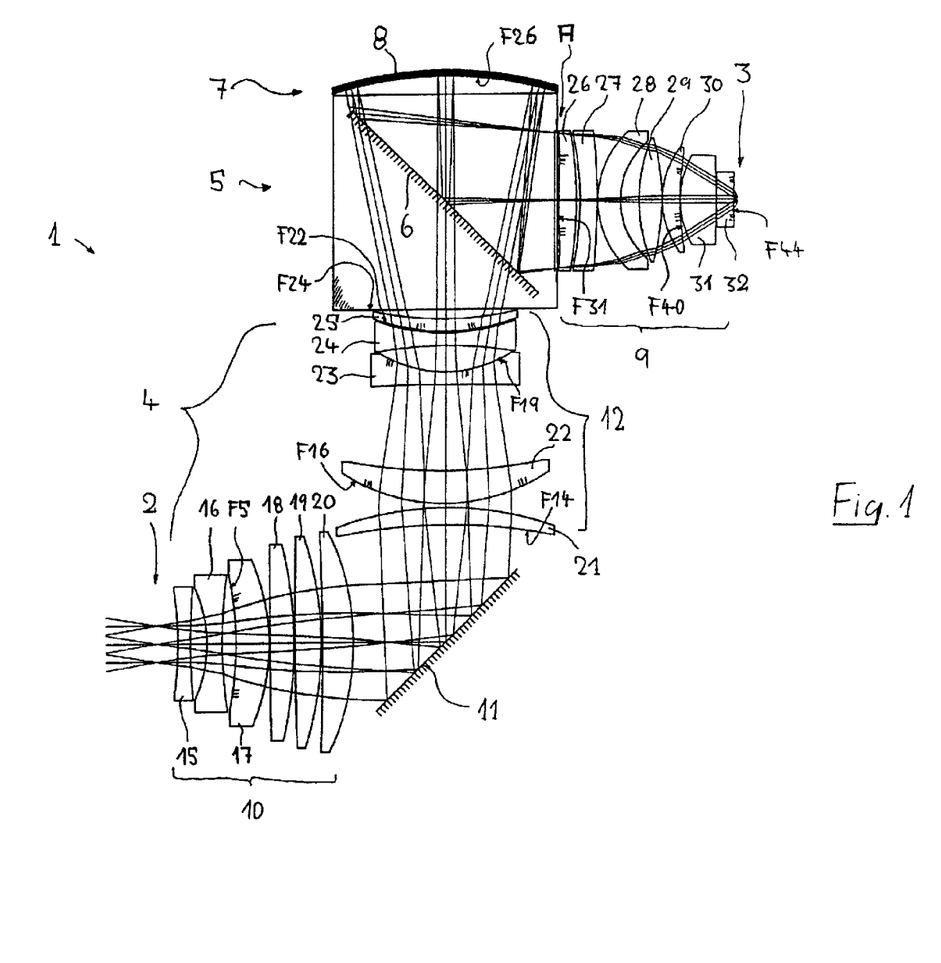
FIG. 1 is a cutaway view of the lens of a first embodiment of the invention.

A typical design of a catadioptric reduction lens according to the invention is shown through a first embodiment example in FIG. 1. It is used to project a pattern of a reticle or the like located on an object plane 2 onto an image plane 3 with negative magnification, e.g., in a ratio of 4:1. The lens system 1 consists of the following components between the object plane 2 and the image plane 3 in the given order: a first lens part 4, a physical beam splitter 5 with a beam splitter surface 6, a mirror group 7 with a concave mirror 8, and, after the beam splitter, a second lens part 9 with positive focal power to create an image of the pattern on the image plane 3.

The first lens part 4 consists of a first lens group 10 after the object plane 2, a plane deviating mirror 11 at an angle of 45° to the optical axis, and a second lens group 12 between the mirror and the beam splitter 5. The deviating mirror 11 in combination with the beam splitter 5 makes it possible to position the mask in the object plane 2 parallel to the wafer in the image plane 3, facilitating the scanner operation for the mask and the wafer. Instead of using an angled shape for the first lens part, a straight design without the deviating mirror 11 is also possible.

As can be seen in FIG. 1, the light enters the projection lens from an illuminator (not shown) on the side of the object plane 2 opposite to the image plane. On its path, it passes through the mask on the image plane. The transmitted light passes through the first lens group 10, is reflected by the deviating mirror 11 in direction of the second lens group 12, through which it passes in direction of the beam splitter 5. Inside the beam splitter, the light transverses the plane beam splitter surface 6 which is positioned at an angle of approx. 45° to the optical axis. After the passage through a quarter wave plate (not shown), the light arrives as the concave, reflecting surface of the concave mirror 8. Reflected by the mirror, the light again passes through the quarter wave plate before it arrives at the beam splitter layer 6 which now reflects the light in direction of the image plane 3. After exiting the beam splitter, the light passes through the second lens part 9, creating an image of the mask on a photosensitive layer of the wafer arranged in the image plane.

The first lens group 10 contains, starting at the object plane 2: a biconcave negative lens 15, a second biconcave negative lens 16, a meniscus lens 17, the concave surface F5 of which is directed on the object plane 2, a biconvex lens 18 with an only slightly curved surface on the object side, a second biconvex lens 19 with a slightly curved surface on the object side, and a meniscus lens 20 with a concave surface on the object side.

The second lens group 12 after the deviating mirror 11 starts with a meniscus lens 21 with a concave surface F13 on the object side, followed by a meniscus lens 22, which is curved the other way and has a convex object-side surface F15.

In an axial distance from the meniscus group 21, 22, there is a subsequent negative lens 23 with a strongly concave exit surface F18, followed by another biconcave negative lens 24. The end of the first lens part and the second lens group 12 is formed by a meniscus lens 25 with a rear concave surface from which a strongly divergent beam exits in direction of the beam splitter 5.

The beam splitter 5 in the embodiments shown consists of two rectangular prisms connected in the area of the beam splitter surface 6, creating a beam splitter cube (BSC). In other embodiments (cf. FIG. 4) a shape other than a cubic shape is provided. This may be, for example, a regular or irregular minimal shape with respect to material volume that is adjusted to the ray trajectory inside the beam splitter such that there are essentially no parts through which no light passes. In the area of the beam splitter surface 6, there is a thin, optically effective layer that is designed in the shown embodiment such that the polarized light coming from the first lens part 4 is transmitted, and the light coming from the mirror 8 is reflected in the direction of the image plane after passing through the quarter wavelength layer twice where, as a result, the preferential polarization direction is turned by 90°. It is thus a polarizing beam splitter, minimizing the loss of light in comparison to alternative semitransparent mirror layers in the area of the beam splitter surface.

In an embodiment that is not shown, the beam splitter layer provided in the area of the beam splitter surface 6 is designed such that the light from the first lens part is first reflected in the direction of a concave mirror that is located on the side of the beam splitter that is opposite to the second lens part 9. The light reflected by this concave mirror is transmitted by the beam splitter layer 6 in the direction of the image plane 6 after passing through a quarter wavelength layer twice. Alternatively to the described beam splitters, it is possible to construct a physical beam splitter with a plane-parallel plate positioned at an angle with the ray trajectory.

After exiting the beam splitter 5, the light enters the second lens part 9. This lens part consists of the following, in the direction of the light passage: a positive lens 26 with a surface in direction of the beam splitter that is only slightly curved, a negative meniscus lens 27 with a concave surface on the object side, a strongly curved meniscus lens 28 with a concave surface on the rear, a biconvex positive lens 29, a meniscus lens 30 with a concave surface on the rear, a thick, biconvex positive lens 31, and lastly a meniscus lens 32 with surfaces that are almost plane and parallel to each other and that are slightly curved in the direction of the object.

In Table 1, the specification of the design is summarized in tabular form in the usual manner. Column 1 lists the number of the refracting or reflecting surface F, column 2 lists the radius r of the area (in mm), column 3 lists the distance d between the surface and the following surface (called thickness) in mm, and column 4 lists the refraction coefficient of the component's material (also known as index) following the entry surface. In column 5, the reflecting surfaces are marked.

In the embodiment, eight of the surfaces, namely the surfaces F5, F16, F19, F22, F26 (mirror surface), F31, F40, and F44, are aspherical. Table 2 lists the corresponding aspherical data. The aspherical surfaces are calculated according to the following formula:

$$p(h)=[((1/r)h^2)/(1+SQRT(1-(1+K)(1/r)^2h^2)]+C1*h^4+C2*h^6$$

In the formula, the inverse of the radius (1/r) is the surface curvature and h is the distance of a point of the surface from the optical axis. p(h) is thus the rise, i.e., the distance between the surface point and the surface peak in z direction or in the direction of the optical axis. The constants K, C1, C2, . . . are listed in Table 2.

The system 1 that can be reproduced with this information is designed for a working wavelength of approx. 157 nm, at which the lens material calcium fluoride that was used for all lenses has a refraction coefficient of n=1.55841. The rear numerical aperture NA is 0.85.

This system without intermediate image is distinguished by some special characteristics that will be explained in more detail in the following. The first lens group 10 before the mirror 11 has a positive focal power in order to focus the light from the object. After being reflected by the deviating mirror 11, the light enters the second lens group 12. The two meniscuses, 21 and 22, at the entry of the second lens part are curved in opposite directions and have a total focal power that is positive. They further narrow the beam diameter so that the group of the three lenses 23, 24, and 25, which is located at a large distance, can be built with lenses of small diameter. The group of three lenses, and in particular the two successive negative lenses 23 and 24, transform the converging beam into a strongly diverging beam while creating a narrow section in the ray trajectory. This beam falls onto the entry surface F24 of the beam splitter 5. By creating a narrow section in the ray trajectory, it is possible to realize strong divergence in the ray trajectory close to the beam splitter while keeping the lens diameter relatively small. The minimum peripheral ray angle is typically larger than approx. 20% or 30% and smaller than 40% of the rear numerical aperture of the projection lens 1. At the same time, the beam splitter cube may be kept small.

The divergent beam passes through the beam splitter surface 6 in direction of the concave mirror 8. The curvature of the reflecting surface F26 is designed such that the beam reflected by the mirror is still convergent but the magnitude of the maximum peripheral ray angle is smaller than the magnitude of the incident divergent beam. The preferred values for the maximum peripheral ray angle for the second passage after being reflected by the mirror is between approx. 10% and 30% of the rear numerical aperture. On one hand, this achieves that the light incident in the second passage is at such an angle that the beam splitter cube can make a contribution to the chromatic correction. On the other hand, too strong convergence is avoided so that after the exit from the beam splitter cube in the area of the second lens part 9, there is sufficient room to build possibly necessary corrective measures. In the example, the magnitude of the maximum paraxial peripheral ray angle during the first passage between the first lens part and the mirror is approx 35% of the numerical aperture while it is approx 23% of the numerical aperture during the second passage behind the mirror.

These favorable peripheral ray angle ratios are made possible by a relatively large focal power of the mirror group, which is exclusively provided by the concave mirror 8 in the embodiment. Between this mirror group and the beam splitter, there is no free-standing lens. However, it is also possible to position at least one lens, for example a negative lens, between the beam splitter and the concave mirror for additional corrections. The concave mirror has a magnification of β=−1.534.

The system aperture A in the embodiment shown is located in the area directly after the exit of the beam from the beam splitter cube 5. Through this design, the beam heights are kept relatively low in the second lens part 9 even for high numerical apertures, permitting a favorable construction of the second lens part with regards to material expenditures.

The second lens part 9 is practically designed so that the rays for the creation of the image can be focused without spreading of the peripheral ray with respect to the image plane 3. For this purpose, two lenses 26, 27 with a low combined focal power are positioned in front of the lens section that is formed by the subsequent lenses 28 to 32 and that has a positive focal power.

For an increase of the numerical aperture to the very high values in this case, it is advantageous for the system aperture to be behind the beam splitter. This is based on the following considerations: a large numerical aperture needs a large mirror diameter and thus a large distance between the concave mirror and the image plane or the wafer. Due to the Lagrange invariant, applied to the pupil image, the principal ray angle is dependent on the diameter of the aperture in that a small aperture needs a large principal ray angle and vice versa. With the large light conductance in this case, if the system aperture were located at the position of the main mirror, the principal ray angle for a small aperture diameter would be so large or the beam splitter block for a large aperture diameter would be so long that the principal ray angle would already be very large at the exit of the beam splitter block, possible larger than the image height. In this case, it is impossible to find a favorable focal power distribution for the second lens part 9 that permits a telecentric principal ray on the rear on one hand and a very large (peripheral ray) aperture with sufficient working distance (from the wafer) on the other hand.

By moving the system aperture behind the beam splitter, however, the principal ray may be collimated simultaneously with reaching the correct image height by using a positive focal power. In order to ensure a sufficient working distance, the positive focal power of the second lens part 9 is positioned behind a lens group with low focal power that is located in the aperture area.

Since the diameter of the peripheral ray does not need to be enlarged as it is necessary for a diverging beam, the axial construction length of the second lens part may be kept low. This contributes to the compact construction of the total lens system 1.

The "unrestricted" beam guidance inside the lens system also has the advantageous consequence that the maximum ray angles at the refracting or reflecting surfaces may be kept small, creating favorable conditions for an effective transmission increase through the coatings of the surfaces. In the first embodiment, the maximum peripheral ray angles, with the exception of the three surfaces closest to the wafer, are generally below 70% or 80% of the rear numerical aperture.

Additional details on the presented design can be seen in Table 3. In Table 3, the parameter TT (total tracklength) indicates the total construction length (in mm) of the lens system in stretched design. The parameter $f_M$ indicates the focal length of the concave mirror. Consequently, $|f_M/TT|$, is the focal length with respect to the construction length. The "focal power" of the mirror equals $\phi_M=1/f_M$. $\beta_M$ represents the magnification of the concave mirror. The parameters $u_1$ and $u_2$ stand for the paraxial peripheral ray angle in front of and behind the mirror respectively. Their size is indicated in percent of the rear numerical aperture NA. The ratio $u_1$ and $u_2$ corresponds to the magnification of the mirror. Furthermore, the working wavelength λ of the embodiment is indicated.

The design shown in FIG. 1 can also be used for other working wavelengths, for example for a working wavelength of approx. 193 nm without major changes to the lens type and the lens arrangement and while maintaining the same characteristics and advantages. A corresponding design of a second embodiment of the invention is shown in Table 4 and Table 6 (aspherical data), using the notation shown above. In contrast to the first embodiment according to FIG. 1 in Table 1, synthetic quartz glass is used as the lens material here. Only for the last two lenses close to the wafer, 31 and 32, fluorspar ($CaF_2$) was used as the material. In this case, it does not serve for the correction of chromatic aberrations but for reducing compaction effects, i.e., changes of material property due to high radiation doses. It is known that calcium fluoride is much less sensitive to these changes than silicon dioxide. In all other regards, the designs of Table 1 and Table 4 differ only very slightly with respect to radii of curvature of the refracting surfaces and their position so that a graphic representation of the 193 nm design generally corresponds to the representation in FIG. 1 as far as the optical elements as well as the beam guidance is concerned. Therefore, a separate graphic representation of the second embodiment example that was optimized for 193 nm is not given here. The design also reaches a numerical aperture NA=0.85 with complete chromatic correction. Additional details can be seen from Table 3.

Figure 2:
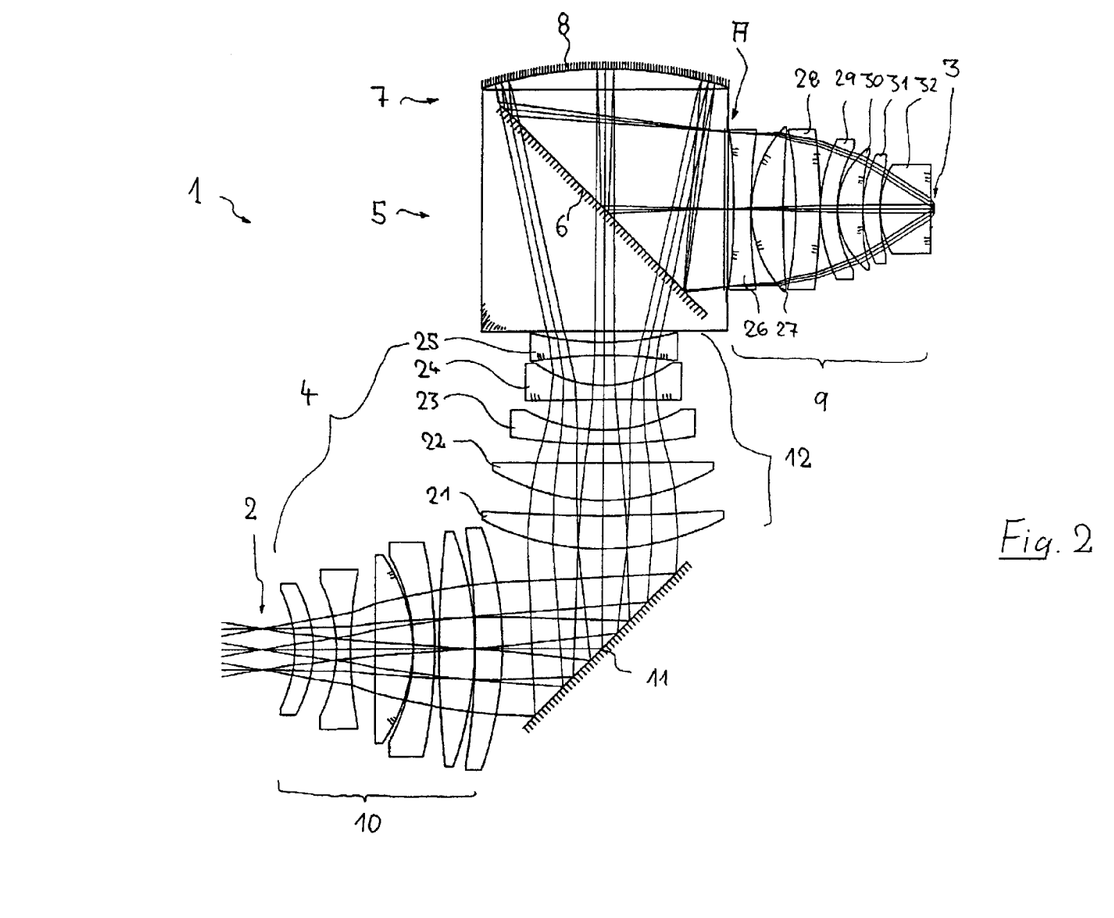
FIG. 2 is a cutaway view of the lens of a third embodiment of the invention.

In FIG. 2, the cutaway view of the lenses of a third embodiment is shown. The detailed specifications can be seen in Table 6 and Table 7 (aspherical data) and in Table 3. The reduction lens 1 designed for a working wavelength of approx. 157 nm has the basic design similar to the embodiment according to FIG. 1 and provides a numerical aperture NA of 0.85 with complete chromatic correction as said embodiment. The same reference marks are used for the corresponding lenses as in FIG. 1. Notable differences from the design according to FIG. 1 are mainly in the construction of the second lens group 12 of the first lens part 4 that follows the deviating mirror 11. Instead of the meniscuses 21 and 22 with opposite curvature used there, this embodiment provides two nearly planoconvex positive lenses 21 and 22 to focus the beam reflected by the mirror 11. The convex entry sides of the lenses face the object side. These lenses are followed by a negative lens 23 at relatively short distance, which in turn is followed by two additional negative lenses 24 and 25. Unlike in the embodiment according to FIG. 1, the creation of the narrow section in the ray trajectory is therefore performed by three negative lenses. As the lenses are distributed across a larger axial section, the narrowing of the beam is gentler so that less strongly refracting surfaces are necessary in total.

In the second lens part 9 following the beam splitter 5, the system aperture A positioned at the exit surface of the beam splitter is followed by a biconcave negative lens 26 and a meniscus lens 27 with positive focal power. Compared to the embodiment according to FIG. 1, the negative focal power concentrated in the area in front of the positive lenses 28 to 32 is larger than in the previous embodiment. This increases the retro-focus effect and permits a larger working distance. This embodiment also avoids strongly curved lens surfaces like in the surfaces of meniscus lens 28 of the embodiment according to FIG. 1

A fourth embodiment that is very similar to the embodiment according to FIG. 2 with only slightly different lens radii and lens positions is not graphically represented due to its similarity to the design according to FIG. 2. Instead it is listed in Table 8, Table 9, and Table 3.

Figure 3:
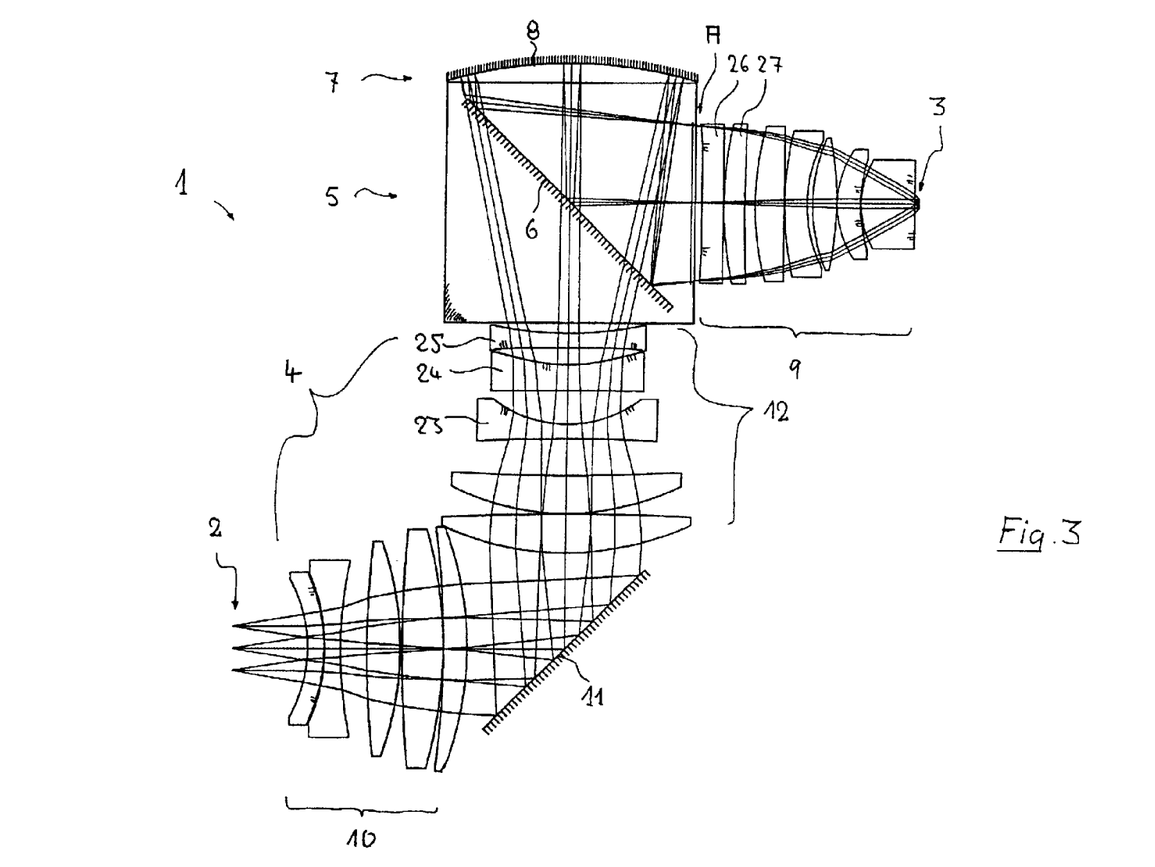
FIG. 3 is a cutaway view of the lens of a fifth embodiment of the invention.

In FIG. 3, a fifth embodiment is shown that is designed for a working wavelength of 157 nm. It permits complete chromatic correction with a numerical aperture of NA=0.80. Details on the arrangement and the design of the optical elements used can be found in Table 10, Table 11 (aspherical data), and Table 3. A comparison with the design in FIG. 2, shows only slight differences with respect to the build-up of the first lens part 4. As a significant difference from the design there, it can be seen that in the second lens part 9, the increase in diameter of the beam in the area of the lenses 26 and 27 directly behind the beam splitter 5 is smaller than in the embodiments shown above. This causes a weak effect of the retro-focus system. However, due to the low numerical aperture, a sufficient working distance is still ensured. As one advantage of this embodiment, it can be seen that the lenses 28 to 32 with total positive focal power following the double lens arrangement 26, 27 can be designed more favorably than in the embodiments above. This also achieves lower angles of incidence of the peripheral rays, facilitating coating these lenses. In addition, only seven instead of eight aspherical surfaces are provided.

Figure 4:
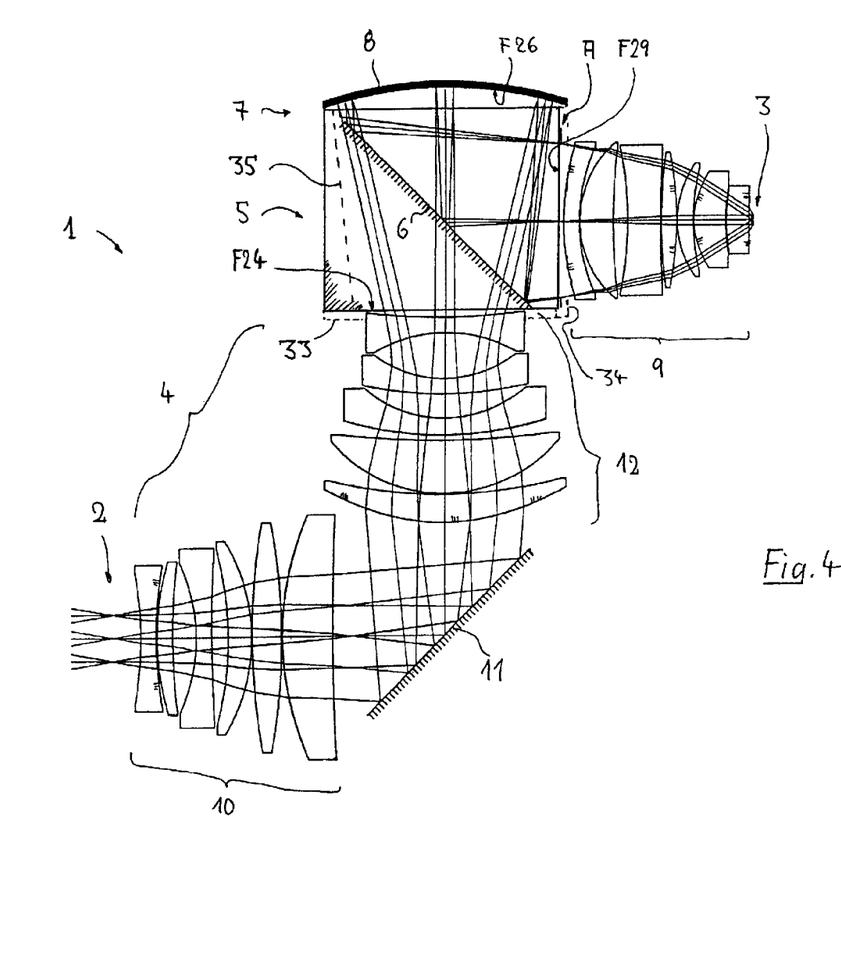
FIG. 4 is a cutaway view of the lens of a sixth embodiment of the invention.

FIG. 4 shows a sixth embodiment, designed for 157 nm, with a rear numerical aperture of NA=0.85 and complete chromatic correction. Construction details for this design may be seen in Tables 12 and 13 (aspherical data) as well as in Table 3. The construction of the first lens part 4 and the second lens part 9 is only slightly different from the design of the third embodiment shown in FIG. 2. An essential difference from the designs above is that in the sixth embodiment, the beam splitter 5 has a shape other than cubic shape, namely the shape of a beam splitter cuboid with unequal edge lengths. The shape of the beam splitter in this particularly economical design with respect to the material used results from the consideration that in traditional beam splitter cubes, large volume parts often do no contribute to the optical effect and can therefore be left out. Accordingly, the beam splitter 5 is minimized with respect to the material volume necessary for the optical projection or at least is approximate to the minimal shape. In the example shown, this is achieved by moving the level entry surface F24 and the level exit surface F29 of the beam splitter block parallel closer to the beam splitter surface 6 than in the embodiment according to FIG. 2. The excess volumes saved by this measure in comparison to the beam splitter cube are indicated by the dashed lines 33 and 34. The position changes of the entry or exit surfaces, and thus the connected creation of a geometrically minimized beam splitter cuboid, also requires slight modifications of the overall design compared to the original cube. It would also be possible to save material by making a possibly angled cut on the side of the beam splitter 5 that is facing the second lens part 9. This cut may be done along line 35, for example, therefore removing material volume from block 5 that is unnecessary because no light passes through it. Therefore irregular shapes of a beam splitter block may also be favorable with respect to material economy. By fitting the outer contour of the beam splitter block to the shape of the maximal irradiated area, considerable material savings may be achieved. Preferably, the maximal irradiated material volume is more than 70%, in particular more than 80% of the outer volume of the beam splitter block so that only little unused material volume remains.

These measures given as an example for minimizing the material volume of a beam splitter block can be advantageous not only for the design of this invention, but also for beam splitters not according to this invention that may be used in other catadioptric projection lenses and/or other optical systems.

A common trait of all the embodiments is that a material saving construction design was realized. The measures for saving material in the area of the beam splitter block 5 were explained in the embodiment according to FIG. 4. In order to achieve good monochromatic correction (high projection power, low aberrations) with the very large numerical apertures that were realized while using little material, several aspherical surfaces are provided in all embodiments. The number of these surfaces is usually not more than eight, or seven for low aperture (embodiment according to FIG. 3). By using aspherical surfaces, reduced material expenditures with respect to lens mass as well as number of lenses may be achieved. A low number of optical surfaces is particularly important for embodiments for short wavelengths, for example 157 nm or less, because for these short wavelengths, sufficient anti-reflection coating is often only possible with great efforts. A reduction of the surface number is therefore advantageous in order to achieve sufficient total transmittancy.

In all embodiments shown, at least one aspherical surface is provided in the area of the system aperture A. Non-spherical surfaces close to the aperture are especially effective for the correction of the spherical aberration and of coma. Accordingly, the rear surface of the first lens of the second lens part 9 that faces the beam splitter is aspherical in all embodiments. In the embodiment according to FIG. 2, the rear entry surface of the following lens is aspherical as well. It is most efficient to employ the aspherical surfaces in an area of large peripheral ray heights, for example where the ratio between the peripheral ray height h and the radius φ of the opening of the system aperture is between approx. 0.8 and approx. 1.2.

Furthermore, aspherical surfaces for the correction or distortion and/or other field aberrations are used in all embodiments. The aspherical surfaces are arranged such that the ratio h/φ between the peripheral ray height h and the radius φ of the system aperture is smaller than approx. 0.8.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

TABLE 1

| Surface F | Radius | Thickness | Index | Refl. |
|---|---|---|---|---|
| 0 | 0 | 23.873 | 1 | |
| 1 | −514.1255 | 15.011 | 1.55841 | |
| 2 | 874.9597 | 19.658 | 1 | |
| 3 | −164.7782 | 17.592 | 1.55841 | |
| 4 | 591.5312 | 16.698 | 1 | |
| 5 | −411.5495 | 39.945 | 1.55841 | |
| 6 | −253.8743 | 0.805 | 1 | |
| 7 | 44050.2337 | 28.964 | 1.55841 | |
| 8 | −488.2655 | 0.819 | 1 | |
| 9 | 6892.6647 | 30.767 | 1.55841 | |
| 10 | −416.1366 | 1.7 | 1 | |
| 11 | −2639.6629 | 36.25 | 1.55841 | |
| 12 | −314 | 125.023 | 1 | |
| 13 | 0 | −125.023 | −1 | REFL |
| 14 | 656.3795 | −20.364 | −1.55841 | |
| 15 | 387.2599 | −5.088 | −1 | |
| 16 | −221.0043 | −38.961 | −1.55841 | |
| 17 | −594.7813 | −104.385 | −1 | |
| 18 | 2025.3852 | −15.114 | −1.55841 | |
| 19 | −130.7295 | −32.824 | −1 | |
| 20 | 450.0559 | −15.487 | −1.55841 | |
| 21 | −237.9966 | −2.286 | −1 | |
| 22 | −233.843 | −15.026 | −1.55841 | |
| 23 | −387.8199 | −11.6 | −1 | |
| 24 | 0 | −260.009 | −1.55841 | |
| 25 | 0 | −21.118 | −1 | |
| 26 | 465.2956 | 21.118 | 1 | REFL |
| 27 | 0 | 130 | 1.55841 | |
| 28 | 0 | −130 | −1.55841 | REFL |
| 29 | 0 | −2.5 | −1 | |
| 30 | 0 | −2.955 | −1 | |
| 31 | −1477.4814 | −20.003 | −1.55841 | |
| 32 | 515.0828 | −4.354 | −1 | |
| 33 | 403.7271 | −20 | −1.55841 | |
| 34 | 863.568 | −0.7 | −1 | |
| 35 | −115.1616 | −26.976 | −1.55841 | |
| 36 | −99.4329 | −20.828 | −1 | |
| 37 | −208.5305 | −27.07 | −1.55841 | |
| 38 | 288.8063 | −0.7 | −1 | |
| 39 | −111.6732 | −20 | −1.55841 | |
| 40 | −290.3444 | −0.7 | −1 | |
| 41 | −115.7493 | −42.235 | −1.55841 | |
| 42 | 1800.1763 | −0.7 | −1 | |
| 43 | −1543.2041 | −20 | −1.55841 | |
| 44 | −1520.1184 | −4.126 | −1 | |
| 45 | 0 | 0 | −1 | |

TABLE 2

| Surface F | K | C1 | C2 | C3 | C4 | C5 | C6 | C7 | C8 |
|---|---|---|---|---|---|---|---|---|---|
| 5 | 0 | −1.91E−09 | −1.44E−13 | −2.00E−18 | −1.60E−22 | | | | |
| 16 | 0 | 3.41E−09 | −4.59E−14 | −1.75E−18 | −2.93E−23 | | | | |
| 19 | 0 | 7.84E−08 | −6.81E−14 | −5.41E−17 | −5.23E−21 | 1.14E−25 | | | |
| 22 | 0 | 2.18E−08 | −6.21E−13 | −3.93E−17 | −5.46E−21 | 3.07E−25 | | | |
| 26 | 0 | −2.75E−10 | −7.95E−15 | −1.39E−19 | −3.14E−24 | −7.02E−29 | | | |
| 31 | 0 | 4.74E−08 | 1.46E−12 | 7.89E−19 | 2.73E−20 | −7.42E−24 | 1.41E−27 | −1.40E−31 | 6.38E−36 |
| 40 | 0 | 8.08E−08 | −1.64E−12 | 2.18E−16 | −3.23E−21 | 9.02E−24 | | | |
| 44 | 0 | −1.84E−07 | −2.16E−10 | −2.04E−13 | 8.20E−17 | 1.26E−23 | −1.07E−34 | | |

TABLE 3

| Embodiment | Tables | FIGURE | TT [mm] | $f_M$ [mm] | $|(f_M/TT)|$ | $\beta_M$ | u1 [% NA] | u2 [% NA] | NA | λ [nm] |
|---|---|---|---|---|---|---|---|---|---|---|
| 1 | 1, 2 | 1 | 1519 | 232.65 | 0.153 | −1.533 | −0.35 | 0.23 | 0.85 | 157 |
| 2 | 4, 5 | | 1544 | 232 | 0.150 | −1.476 | −0.36 | 0.24 | 0.85 | 193 |
| 3 | 6, 7 | 2 | 1493 | 225.53 | 0.151 | −1.662 | −0.37 | 0.23 | 0.85 | 157 |
| 4 | 8, 9 | | 1502 | 226.89 | 0.151 | −1.633 | −0.37 | 0.23 | 0.85 | 157 |
| 5 | 10, 11 | 3 | 1399 | 218.22 | 0.156 | −1.683 | −0.38 | 0.23 | 0.8 | 157 |
| 6 | 12, 13 | 4 | 1280 | 191.46 | 0.150 | −1.892 | −0.41 | 0.22 | 0.85 | 157 |

TABLE 4

| Surface F | Radius | Thickness | Index | Refl. |
|---|---|---|---|---|
| 0 | 0 | 23.447 | 1 | |
| 1 | −576.9069 | 8.474 | 1.5603 | |
| 2 | 638.6311 | 18.73 | 1 | |
| 3 | −170.9523 | 19.632 | 1.5603 | |
| 4 | 521.3895 | 16.932 | 1 | |
| 5 | −443.5956 | 41.675 | 1.5603 | |
| 6 | −251.4028 | 0.994 | 1 | |
| 7 | 3243.2688 | 31.68 | 1.5603 | |
| 8 | −569.5097 | 0.903 | 1 | |
| 9 | 2219.3899 | 35.048 | 1.5603 | |
| 10 | −520.3404 | 0.96 | 1 | |
| 11 | 12078.1166 | 44.949 | 1.5603 | |
| 12 | −331.0159 | 122.402 | 1 | |
| 13 | 0 | −122.402 | −1 | REFL |
| 14 | 793.0349 | −28.276 | −1.5603 | |
| 15 | 642.0364 | −22.727 | −1 | |
| 16 | −185.9374 | −35.834 | −1.5603 | |
| 17 | −417.8538 | −101.974 | −1 | |
| 18 | −1912.6548 | −7.473 | −1.5603 | |
| 19 | −136.8289 | −37.657 | −1 | |
| 20 | 255.9776 | −15.458 | −1.5603 | |
| 21 | −202.357 | −4.312 | −1 | |
| 22 | −223.8885 | −17.089 | −1.5603 | |
| 23 | −978.2462 | −5.741 | −1 | |
| 24 | 0 | −260 | −1.5603 | |
| 25 | 0 | −21.803 | −1 | |

TABLE 4-continued

| Surface F | Radius | Thickness | Index | Refl. |
|---|---|---|---|---|
| 26 | 463.9965 | 21.803 | 1 | REFL |
| 27 | 0 | 130 | 1.5603 | |
| 28 | 0 | −130 | −1.5603 | REFL |
| 29 | 0 | −4.302 | −1 | |
| 30 | 0 | −0.878 | −1 | |
| 31 | −4338.7149 | −22.61 | −1.5603 | |
| 32 | 2656.0923 | −4.077 | −1 | |
| 33 | 1449.3709 | −23.548 | −1.5603 | |
| 34 | 1224.1815 | −0.7 | −1 | |
| 35 | −105.5392 | −26.164 | −1.5603 | |
| 36 | −91.7838 | −20.544 | −1 | |
| 37 | −167.6512 | −25.83 | −1.5603 | |
| 38 | 628.2533 | −0.7 | −1 | |
| 39 | −95.9777 | −21.796 | −1.5603 | |
| 40 | −360.1319 | −0.7 | −1 | |
| 41 | −121.3189 | −39.046 | −1.50144 | |
| 42 | −162.6721 | −0.7 | −1 | |
| 43 | −144.838 | −19.722 | −1.50144 | |
| 44 | −6676.3755 | −4.034 | −1 | |
| 45 | 0 | 0 | −1 | |

TABLE 5

| Surface F | K | C1 | C2 | C3 | C4 | C5 | C6 | C7 | C8 |
|---|---|---|---|---|---|---|---|---|---|
| 5 | 0 | −1.09E−09 | −1.13E−13 | −3.70E−18 | −1.87E−22 | 1.76E−26 | −2.95E−30 | | |
| 16 | 0 | 1.43E−09 | −1.02E−13 | −3.78E−18 | −4.26E−23 | −4.09E−27 | | | |
| 19 | 0 | 6.14E−08 | −7.16E−13 | −8.98E−17 | −7.17E−21 | −4.17E−25 | | | |
| 22 | 0 | 2.49E−08 | −9.38E−13 | −1.56E−17 | −4.46E−21 | 2.39E−25 | | | |
| 26 | 0 | −1.20E−09 | −3.09E−14 | −6.56E−19 | −6.03E−24 | −4.20E−28 | | | |
| 31 | 0 | 1.36E−08 | 4.96E−13 | 8.40E−19 | −1.98E−20 | 4.11E−24 | −4.08E−28 | 1.09E−32 | |
| 40 | 0 | 8.37E−09 | −3.01E−14 | 1.94E−17 | 4.31E−20 | −7.77E−24 | 7.02E−28 | | |
| 44 | 0 | −1.57E−07 | 3.14E−10 | −4.05E−13 | 7.62E−16 | −7.28E−19 | | | |

TABLE 6

| Surface F | Radius | Thickness | Index | Refl. |
|---|---|---|---|---|
| 0 | 0 | 34.921 | 1 | |
| 1 | −144.147 | 20 | 1.55841 | |
| 2 | −143.5689 | 24.849 | 1 | |
| 3 | −158.057 | 15 | 1.55841 | |
| 4 | 445.5917 | 26.465 | 1 | |
| 5 | −362291.091 | 41.157 | 1.55841 | |
| 6 | −167.7266 | 0.731 | 1 | |
| 7 | −204.1721 | 23.093 | 1.55841 | |
| 8 | −521.4298 | 4.512 | 1 | |
| 9 | 1233.1796 | 38.161 | 1.55841 | |
| 10 | −355.3331 | 0.7 | 1 | |
| 11 | −785.3737 | 30 | 1.55841 | |
| 12 | −367.3718 | 107.715 | 1 | |
| 13 | 0 | −107.715 | −1 | REFL |
| 14 | −285.7912 | −35.606 | −1.55841 | |
| 15 | −1724.253 | −15.9 | −1 | |
| 16 | −236.6968 | −39.993 | −1.55841 | |
| 17 | −9508.9014 | −20.148 | −1 | |
| 18 | −644.5295 | −15.053 | −1.55841 | |
| 19 | −178.8829 | −32.313 | −1 | |
| 20 | 1546.3666 | −14.968 | −1.55841 | |
| 21 | −127.6893 | −32.237 | −1 | |
| 22 | 495.5614 | −14.016 | −1.55841 | |
| 23 | −320.2759 | −11.993 | −1 | |
| 24 | 0 | −259.835 | −1.55841 | |
| 25 | 0 | −21.856 | −1 | |
| 26 | 451.0521 | 21.856 | 1 | REFL |
| 27 | 0 | 129.918 | 1.55841 | |
| 28 | 0 | −129.918 | −1.55841 | REFL |
| 29 | 0 | −2.5 | −1 | |
| 30 | 0 | −7.158 | −1 | |
| 31 | 960.72 | −18.405 | −1.55841 | |
| 32 | −655.2188 | −1.009 | −1 | |
| 33 | −146.1225 | −33.261 | −1.55841 | |
| 34 | −1131.294 | −13.637 | −1 | |
| 35 | 434.9503 | −24.693 | −1.55841 | |
| 36 | 593.2116 | −0.7 | −1 | |
| 37 | −167.6296 | −18 | −1.55841 | |
| 38 | −132.7409 | −0.7 | −1 | |
| 39 | −84.2028 | −26.09 | −1.55841 | |
| 40 | −474.4717 | −0.7 | −1 | |
| 41 | −131.1971 | −18.013 | −1.55841 | |
| 42 | −190.6516 | −0.701 | −1 | |
| 43 | −98.2752 | −52.926 | −1.55841 | |
| 44 | −28685.5352 | −4.061 | −1 | |
| 45 | 0 | 0 | −1 | |

TABLE 8

| Surface F | Radius | Thickness | Index | Refl. |
|---|---|---|---|---|
| 0 | 0 | 35.442 | 1 | |
| 1 | −136.4043 | 15 | 1.55841 | |
| 2 | −136.4127 | 30.561 | 1 | |
| 3 | −148.1696 | 15.611 | 1.55841 | |
| 4 | 496.3223 | 27.462 | 1 | |
| 5 | −6515.4006 | 40 | 1.55841 | |
| 6 | −175.9965 | 0.7 | 1 | |
| 7 | −217.2231 | 22.309 | 1.55841 | |
| 8 | −402.0377 | 3.157 | 1 | |
| 9 | 1094.4566 | 39.559 | 1.55841 | |
| 10 | −366.1274 | 0.7 | 1 | |
| 11 | −606.9599 | 21.178 | 1.55841 | |
| 12 | −344.2934 | 125 | 1 | |
| 13 | 0 | −125 | −1 | REFL |
| 14 | −256.8607 | −35.242 | −1.55841 | |
| 15 | −1073.3629 | −0.7 | −1 | |
| 16 | −238.0238 | −40 | −1.55841 | |
| 17 | −10795.1914 | −18.391 | −1 | |
| 18 | −598.3939 | −15.331 | −1.55841 | |
| 19 | −183.3664 | −22.55 | −1 | |
| 20 | −3632.8802 | −15 | −1.55841 | |
| 21 | −124.0037 | −36.596 | −1 | |
| 22 | 334.4845 | −15 | −1.55841 | |
| 23 | −351.348 | −11.495 | −1 | |
| 24 | 0 | −259.916 | −1.55841 | |
| 25 | 0 | −21.739 | −1 | |
| 26 | 453.7818 | 21.739 | 1 | REFL |
| 27 | 0 | 129.958 | 1.55841 | |
| 28 | 0 | −129.958 | −1.55841 | REFL |
| 29 | 0 | −2.5 | −1 | |
| 30 | 0 | −10.611 | −1 | |
| 31 | 441.3057 | −20 | −1.55841 | |
| 32 | −1362.4398 | −0.7 | −1 | |
| 33 | −137.4273 | −33.622 | −1.55841 | |
| 34 | −802.6309 | −10.323 | −1 | |
| 35 | 1035.8108 | −24.037 | −1.55841 | |
| 36 | 3460.0271 | −0.7 | −1 | |
| 37 | −180.4152 | −20 | −1.55841 | |
| 38 | −142.5835 | −0.7 | −1 | |
| 39 | −85.8684 | −24.909 | −1.55841 | |
| 40 | −420.7458 | −0.7 | −1 | |
| 41 | −121.5434 | −20 | −1.55841 | |
| 42 | −170.3607 | −0.7 | −1 | |
| 43 | −88.9044 | −52.562 | −1.55841 | |
| 44 | −1435.4203 | −4.158 | −1 | |
| 45 | 0 | 0 | −1 | |

TABLE 7

| Surface F | K | C1 | C2 | C3 | C4 | C5 | C6 | C7 | C8 | C9 |
|---|---|---|---|---|---|---|---|---|---|---|
| 6 | 0 | 8.43E−09 | 1.79E−13 | 4.97E−18 | −3.05E−22 | 5.83E−26 | −2.28E−30 | −6.73E−34 | 8.91E−38 | −3.43E−42 |
| 20 | 0 | −5.28E−08 | 5.01E−12 | −3.19E−16 | 3.55E−20 | −3.52E−24 | −1.17E−29 | 7.01E−32 | −8.69E−36 | 3.43E−40 |
| 22 | 0 | 1.96E−08 | −1.76E−12 | −3.33E−17 | 2.21E−20 | −7.35E−24 | 5.06E−28 | 1.95E−31 | −4.82E−35 | 3.11E−39 |
| 31 | 0 | 3.74E−08 | −4.29E−12 | 5.69E−16 | −5.41E−20 | 2.63E−24 | 1.41E−28 | −4.22E−33 | −2.53E−36 | 1.99E−40 |
| 33 | 0 | −7.28E−08 | 2.53E−12 | −5.66E−16 | 5.21E−20 | −2.73E−24 | −1.56E−28 | 4.86E−33 | 1.62E−36 | −1.58E−40 |
| 36 | 0 | −4.71E−08 | 4.18E−12 | 4.85E−16 | −1.11E−19 | 9.25E−24 | −5.40E−28 | −1.21E−31 | 2.84E−35 | −1.60E−39 |
| 40 | 0 | −1.78E−07 | −2.45E−11 | 2.53E−16 | 3.65E−19 | −1.34E−22 | −3.39E−27 | 8.65E−30 | −2.02E−33 | 1.26E−37 |
| 44 | 0 | −2.79E−07 | 2.75E−10 | −9.23E−14 | 2.19E−16 | 2.15E−27 | 2.76E−31 | 2.74E−31 | −7.16E−27 | 1.15E−29 |

TABLE 9

| Surface F | K | C1 | C2 | C3 | C4 | C5 | C6 |
|---|---|---|---|---|---|---|---|
| 6 | 0 | 6.79E−09 | 1.43E−13 | 3.37E−18 | 3.89E−23 | | |
| 20 | 0 | −1.98E−08 | 2.45E−12 | −7.82E−17 | 5.18E−21 | −1.63E−26 | −1.04E−29 |
| 22 | 0 | −5.02E−08 | −1.02E−12 | −4.11E−17 | 5.56E−21 | −1.58E−24 | |
| 31 | 0 | 2.13E−08 | −4.19E−12 | 6.56E−16 | −5.80E−20 | 2.93E−24 | |
| 33 | 0 | −5.77E−08 | 3.12E−12 | −6.22E−16 | 5.56E−20 | −3.26E−24 | −3.99E−29 |
| 36 | 0 | −4.68E−08 | 3.75E−12 | 6.37E−16 | −1.42E−19 | 6.45E−24 | |
| 40 | 0 | −1.84E−07 | −1.96E−11 | −5.18E−16 | 4.29E−19 | −8.45E−23 | |

TABLE 10

| Surface F | Radius | Thickness | Index | Refl. |
|---|---|---|---|---|
| 0 | 0 | 75.023 | 1 | |
| 1 | −147.1623 | 15.984 | 1.55841 | |
| 2 | −180.9092 | 0.7 | 1 | |
| 3 | −195.2149 | 16.044 | 1.55841 | |
| 4 | 429.6174 | 25.915 | 1 | |
| 5 | 1041.8189 | 32.79 | 1.55841 | |
| 6 | −323.4463 | 1.842 | 1 | |
| 7 | 1391.461 | 40 | 1.55841 | |
| 8 | −434.9808 | 0.7 | 1 | |
| 9 | −867.3896 | 23.643 | 1.55841 | |
| 10 | −340.2224 | 96.83 | 1 | |
| 11 | 0 | −96.83 | −1 | REFL |
| 12 | −284.7532 | −39.085 | −1.55841 | |
| 13 | 2733.3227 | −0.7 | −1 | |
| 14 | −251.834 | −37.88 | −1.55841 | |
| 15 | −1890.6267 | −37.107 | −1 | |
| 16 | 1652.3835 | −15 | −1.55841 | |
| 17 | −123.2342 | −34.072 | −1 | |
| 18 | 7167.3148 | −26.162 | −1.55841 | |
| 19 | −161.5294 | −16.98 | −1 | |
| 20 | −7689.1844 | −15 | −1.55841 | |
| 21 | −364.447 | −10.232 | −1 | |
| 22 | 0 | −239.911 | −1 | |
| 23 | 0 | −19.521 | −1 | |
| 24 | 436.4421 | 19.521 | 1 | REFL |
| 25 | 0 | 119.955 | 1.55841 | |
| 26 | 0 | −119.955 | −1.55841 | REFL |
| 27 | 0 | −2.5 | −1 | |
| 28 | 0 | −7.32 | −1 | |
| 29 | −11835.2915 | −21.153 | −1.55841 | |
| 30 | −22182.225 | −0.7 | −1 | |
| 31 | −395.2489 | −20 | −1.55841 | |
| 32 | −1962.5819 | −10.468 | −1 | |
| 33 | −299.9226 | −27.263 | −1.55841 | |
| 34 | −25197.9401 | −0.752 | −1 | |
| 35 | −321.0548 | −22.837 | −1.55841 | |
| 36 | −144.5063 | −5.603 | −1 | |
| 37 | −178.0837 | −22.597 | −1.55841 | |
| 38 | 338.4456 | −0.7 | −1 | |
| 39 | −96.0589 | −23.237 | −1.55841 | |
| 40 | −141.1939 | −0.871 | −1 | |
| 41 | −94.5774 | −51.253 | −1.55841 | |
| 42 | −970.0583 | −4.18 | −1 | |
| 43 | 0 | 0 | −1 | |

TABLE 12

| Surface F | Radius | Thickness | Index | Refl. |
|---|---|---|---|---|
| 0 | 0 | 26.737 | 1 | |
| 1 | −366.9645 | 15 | 1.55841 | |
| 2 | 415.6221 | 0.708 | 1 | |
| 3 | 256.8403 | 15 | 1.55841 | |
| 4 | 600.266 | 22.819 | 1 | |
| 5 | −168.4344 | 15 | 1.55841 | |
| 6 | 1523.0512 | 16.298 | 1 | |
| 7 | −320.6541 | 23.151 | 1.55841 | |
| 8 | −177.2161 | 0.7 | 1 | |
| 9 | 696.7469 | 28.536 | 1.55841 | |
| 10 | −556.3056 | 0.7 | 1 | |
| 11 | 305.0769 | 48.354 | 1.55841 | |
| 12 | 2871.7213 | 109.377 | 1 | |
| 13 | 0 | −109.377 | −1 | REFL |
| 14 | −199.288 | −27.759 | −1.55841 | |
| 15 | −448.2896 | −0.789 | −1 | |
| 16 | −144.8182 | −51.573 | −1.55841 | |
| 17 | −814.4178 | −5.106 | −1 | |
| 18 | −336.8842 | −16.074 | −1.55841 | |
| 19 | −118.996 | −23.692 | −1 | |
| 20 | −356.8073 | −15 | −1.55841 | |
| 21 | −114.0033 | −43.916 | −1 | |
| 22 | 139.4303 | −15 | −1.55841 | |
| 23 | −603.1581 | −7.132 | −1 | |
| 24 | 0 | −194.813 | −1.55841 | |
| 25 | 0 | −20.251 | −1 | |
| 26 | 382.9129 | 20.251 | 1 | REFL |
| 27 | 0 | 109.907 | 1.55841 | |
| 28 | 0 | −109.907 | −1.55841 | REFL |
| 29 | 0 | −2.5 | −1 | |
| 30 | 0 | −2.5 | −1 | |
| 31 | −243.6014 | −15 | −1.55841 | |
| 32 | −167.8596 | −0.7 | −1 | |
| 33 | −100.3661 | −31.95 | −1.55841 | |
| 34 | −593.7295 | −13.613 | −1 | |
| 35 | 366.2235 | −31.682 | −1.55841 | |
| 36 | −1205.5606 | −0.7 | −1 | |
| 37 | −474.0574 | −15 | −1.55841 | |
| 38 | 287.5815 | −0.7 | −1 | |
| 39 | −96.5382 | −15 | −1.55841 | |
| 40 | −218.7472 | −0.7 | −1 | |
| 41 | −77.7014 | −30.491 | −1.55841 | |
| 42 | −204.5141 | −0.7 | −1 | |
| 43 | −202.1856 | −21.49 | −1.55841 | |
| 44 | −39102.8993 | −4.022 | −1 | |
| 45 | 0 | 0 | −1 | |

TABLE 11

| Surface F | K | C1 | C2 | C3 | C4 | C5 | C6 | C7 | C8 |
|---|---|---|---|---|---|---|---|---|---|
| 2 | 0 | 1.58E−08 | 6.70E−13 | 2.30E−17 | 1.07E−22 | −7.06E−27 | | | |
| 17 | 0 | −2.95E−08 | −1.03E−12 | 3.89E−17 | −1.19E−21 | 2.40E−24 | −7.20E−29 | | |
| 19 | 0 | 1.39E−07 | 4.23E−12 | 1.09E−16 | −1.59E−20 | | | | |
| 20 | 0 | 4.78E−08 | 4.96E−12 | 3.33E−16 | | | | | |
| 29 | 0 | 4.62E−08 | 5.21E−13 | 2.76E−16 | −1.12E−19 | 3.26E−23 | −5.38E−27 | 4.85E−31 | −1.79E−35 |
| 40 | 0 | 2.00E−07 | 7.54E−12 | −1.60E−15 | 6.10E−20 | 1.08E−23 | | | |
| 42 | 0 | −3.82E−07 | 3.51E−10 | −9.86E−14 | −9.85E−16 | 1.57E−18 | | | |

TABLE 13

| Surface F | K | C1 | C2 | C3 | C4 | C5 | C6 | C7 | C8 |
|---|---|---|---|---|---|---|---|---|---|
| 2 | 0 | −6.26E−09 | 2.06E−12 | −6.06E−17 | 9.79E−21 | −1.35E−24 | 9.00E−29 | | |
| 14 | 0 | 1.72E−08 | 3.66E−13 | 8.90E−18 | 1.17E−22 | 7.83E−27 | | | |
| 26 | 0 | −5.67E−11 | −3.02E−14 | −6.77E−19 | −1.74E−22 | 1.78E−26 | −1.75E−30 | 8.35E−35 | −2.03E−39 |
| 31 | 0 | 1.96E−08 | 1.34E−12 | −1.76E−16 | 1.43E−19 | −5.09E−23 | 1.14E−26 | −1.39E−30 | 7.66E−35 |
| 38 | 0 | −5.60E−08 | −6.60E−12 | 1.87E−15 | −5.30E−19 | 1.03E−22 | −7.02E−27 | | |
| 41 | 0 | −5.82E−09 | 1.33E−11 | 4.77E−15 | 9.39E−18 | −3.77E−21 | 1.63E−24 | | |
| 44 | 0 | −3.20E−07 | 3.78E−10 | 6.07E−13 | −1.98E−15 | 6.11E−18 | −7.14E−21 | | |

What is claimed is:

1. A catadioptric projection lens for projecting a pattern located on an object plane onto an image plane, wherein, between the object plane and the image plane, the following are arranged in the given order:
   a first objective part, which creates a ray;
   a physical beam splitter with a beam splitter surface, whereby the ray created by the first objective part is directed to the physical beam splitter;
   a mirror group receiving light directly from the beam splitter and returning light directly to the beam splitter, the mirror group having a refractive power and a concave mirror; and
   a second objective part with positive refractive power, which creates an image of the pattern on the image plane, wherein the refractive power of the mirror group is calculated such that a divergent beam incident on the mirror group is transformed into a convergent beam and the system aperture is located imagewise behind the concave mirror and is located between the beam splitter surface and the image plane;
   wherein no free-standing lens is placed between the beam splitter surface and the concave mirror.

2. A projection lens according to claim 1, wherein the system aperture is located close to or on a rear exit surface of the beam splitter.

3. A projection lens according to claim 1, wherein the refractive power of the mirror group is calculated such that the sum of the absolute values of the peripheral ray angles of beams incident on the mirror group and of beams exiting from the mirror group are much larger than zero.

4. A projection lens according to claim 1, wherein the first objective part is designed for creating a divergent beam directed to the beam splitter.

5. A projection lens according to claim 1, wherein the first objective part is designed such that an exiting divergent beam has a minimum peripheral ray angle of more than 20% of the image side numerical aperture of the projection lens.

6. A projection lens according to claim 1, wherein the first objective part in front of the beam splitter has a negative refractive power adapted to create a waist section in the ray trajectory.

7. A projection lens according to claim 1, wherein the beam exiting on the image side of the mirror group has a peripheral ray angle of more than 10% of the image side numerical aperture.

8. A projection lens according to claim 1, wherein the absolute value of the peripheral ray angle of the rays arriving at the mirror group is larger than the absolute value of the peripheral ray angle of the rays emitted from the mirror group.

9. A projection lens according to claim 1, wherein the concave mirror has a positive magnification.

10. A projection lens according to claim 1, wherein the first objective part contains a deviating mirror, a first lens group between the object plane and the deviating mirror, and a second lens group between the deviating mirror and the beam splitter.

11. A projection lens according to claim 1, wherein the second objective part is constructed in the manner of a retro focus objective, with at least one lens with negative refractive power between the beam splitter and the rear lenses with a total positive refractive power.

12. A projection lens according to claim 1, wherein the beam splitter surface is arranged in a beam splitter serving as a supporting body and the system aperture is positioned outside of the beam splitter.

13. A projection lens according to claim 1, wherein the beam splitter surface is positioned in a beam splitter block that has an optical minimal shape other than cubic shape, and wherein the maximum radiated material volume is more than 70% of the outer volume of the beam splitter block.

14. A projection lens according to claim 1, wherein the beam splitter surface is a polarizing beam splitter surface and a quarter wave plate is positioned between the beam splitter surface and the concave mirror.

15. A projection lens according to claim 1, wherein all transparent optical components are made of the same material.

16. A projection lens according to claim 1, wherein the second objective part contains no correction means with a first lens material and a second lens material of different dispersion for correcting chromatic aberration.

17. A projection lens according to claim 1, wherein the image side numerical aperture is more than approx. 0.7.

18. A projection lens according to claim 1, wherein the projection lens is constructed such that the pattern is projected onto the image plane without creating an intermediate image.

19. A projection lens according to claim 1, wherein the sine of the maximum beam angle at a refracting or reflecting surface for all surfaces, with the exception of a maximum of three most imagewise surfaces, is less than 80% or 70% of the image side numerical aperture.

20. A projection lens according to claim 1, comprising at least one optical component with at least one aspherical surface.

21. A projection lens according to claim 1, wherein at least one aspherical surface is positioned in the area of the system aperture and at least one aspherical surface is positioned in the area of at least one of the object plane and the image plane.

22. A method for manufacturing semiconductor devices and other microdevices with the following steps:
   providing a mask with a given pattern;
   illuminating the mask with ultraviolet light of a given wavelength; and
   projecting an image of the pattern on a photosensitive substrate located in the area of the image plane of the projection lens with the help of a catadioptric projection lens comprising, between the object plane and the image plane and in the given order:

a first objective part, which creates a ray;

a physical beam splitter with a beam splitter surface and to which the ray is directed;

a mirror group receiving light directly from the beam splitter and returning light directly to the beam splitter, the mirror group having a refractive power and a concave mirror; and a second objective part with positive refractive power, which creates an image of the pattern on the image plane, wherein the refractive power of the mirror group is calculated such that a divergent beam incident on the mirror group is transformed into a convergent beam and the system aperture is located imagewise behind the concave mirror and is located between the beam splitter surface and the image plane;

wherein no free-standing lens is placed between the beam splitter surface and the concave mirror.

23. A catadioptric projection lens for projecting a pattern located on an object plane onto an image plane, wherein, between the object plane and the image plane, the following are arranged in the given order:

a first objective part, which creates a ray;

a physical beam splitter with a beam splitter surface, whereby the ray created by the first objective part is directed to the physical beam splitter;

a mirror group with a refractive power of the mirror group and a concave mirror; and a second objective part with positive refractive power, which creates an image of the pattern on the image plane, wherein:

the refractive power of the mirror group is calculated such that a divergent beam incident on the mirror group is transformed into a convergent beam, the system aperture is located imagewise behind the concave mirror, the beam splitter surface is positioned in a beam splitter block that has an optical minimal shape other than cubic shape, and the maximum radiated material volume is more than 70% of the outer volume of the beam splitter block.

24. A projection lens according to claim 23, wherein the beam splitter surface is arranged in a beam splitter serving as a supporting body and the system aperture is positioned outside of the beam splitter.

25. A projection lens according to claim 23, wherein the beam splitter surface is a polarizing beam splitter surface and a quarter wave plate is positioned between the beam splitter surface and the concave mirror.

26. A catadioptric projection lens for projecting a pattern located on an object plane onto an image plane, wherein, between the object plane and the image plane, the following are arranged in the given order:

a first objective part, which creates a ray;

a physical beam splitter with a beam splitter surface, whereby the ray created by the first objective part is directed to the physical beam splitter;

a mirror group with a refractive power of the mirror group and a concave mirror; and a second objective part with positive refractive power, which creates an image of the pattern on the image plane, wherein:

the refractive power of the mirror group is calculated such that a divergent beam incident on the mirror group is transformed into a convergent beam, the system aperture is located imagewise behind the concave mirror and is located between the beam splitter surface and the image plane, and the image side numerical aperture of the projection lens is more than approx. 0.7.

27. A projection lens according to claim 26, wherein the beam splitter surface is a polarizing beam splitter surface and a quarter wave plate is positioned between the beam splitter surface and the concave mirror.

28. A projection lens according to claim 26, wherein the projection lens is constructed such that the pattern is projected onto the image plane without creating an intermediate image.

* * * * *